United States Patent

Wakata et al.

[11] Patent Number: 5,571,642
[45] Date of Patent: Nov. 5, 1996

[54] PHOTOSENSITIVE RESIN COMPOSITION, COLOR FILTER USING THE SAME, AND METHOD OF PRODUCING A COLOR FILTER

[75] Inventors: Yuichi Wakata; Koji Inoue, both of Shizuoka, Japan

[73] Assignee: Fuji Photo Film Co., Ltd., Kanagawa, Japan

[21] Appl. No.: 549,542

[22] Filed: Oct. 27, 1995

[30] Foreign Application Priority Data

Oct. 28, 1994 [JP] Japan .................................. 6-265182

[51] Int. Cl.$^6$ ............................................. G03C 1/73
[52] U.S. Cl. ................................. 430/7; 430/6; 430/260; 430/261; 430/270.1; 430/280.1; 430/283.1; 430/288.1
[58] Field of Search ................................... 430/6, 7, 260, 430/261, 270.1, 280.1, 283.1, 288.1

[56] References Cited

U.S. PATENT DOCUMENTS

| | | | |
|---|---|---|---|
| 4,229,514 | 10/1980 | Kurita et al. | 430/270.1 |
| 4,251,618 | 2/1981 | McCartin et al. | 430/270.1 |
| 4,946,761 | 8/1990 | Maemoto | 430/270.1 |

*Primary Examiner*—Hoa Van Le
*Attorney, Agent, or Firm*—Sughrue, Mion, Zinn, Macpeak & Seas

[57] ABSTRACT

A photosensitive resin composition which comprises a resin containing at least one repeating unit represented by the following general formulae (I) and (II):

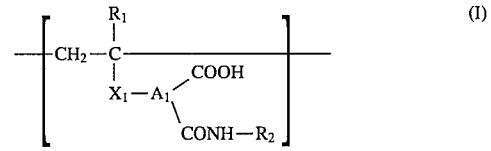

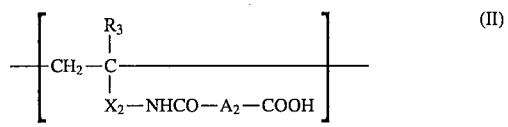

The photosensitive resin composition is soluble in an aqueous alkaline solution and the cured product thereof has good alkali resistance. Furthermore, the resin composition not only has excellent solubility and production suitability, but also has high chemical resistance.

3 Claims, No Drawings

PHOTOSENSITIVE RESIN COMPOSITION, COLOR FILTER USING THE SAME, AND METHOD OF PRODUCING A COLOR FILTER

FIELD OF THE INVENTION

The present invention relates to a photosensitive resin composition and, more particularly, to a photosensitive resin composition which can be developed with an aqueous alkaline solution when cured by exposure and subsequent thermal treatment, the resin composition acquires excellent chemical resistance, including alkali resistance. The photosensitive resin composition of the present invention is especially useful for forming the protective layer of a color filter.

BACKGROUND OF THE INVENTION

Various photosensitive resin-compositions are known, and are widely used in various applications, e.g., as printing plates, color proofs, resists for producing printed circuit frames, color filters and the like. Those compositions form images by undergoing processing operations depending on their intended use. In many cases, the processing operations basically comprise imagewise pattern exposure and development-processing. Methods for the development-processing are classified roughly into those using organic solvents as a developer and those using alkaline aqueous solutions as a developer. In recent years, however, methods of using alkaline aqueous solutions have prevailed over those using organic solvents from the viewpoint of environmental conservation safety in the working environment, and the like.

Therefore, a large number of binder resins soluble in an alkaline aqueous solution have been developed and used for photosensitive resin compositions. Examples of such binder resins include poly(meth)acrylic acid, polycinnamic acid, polymaleic acid, polymaleic anhydride, polyitaconic acid and like homopolymers, and copolymers prepared from the above-noted monomers and various other monomers.

Specific examples of such resins include methacrylic acid copolymers, acrylic acid copolymers, itaconic acid copolymers, crotonic acid copolymers, maleic acid copolymers and partially esterified maleic acid copolymers as described in JP-B-59-44615 (the term "JP-B" as used herein means an "examined Japanese patent publication"), JP-B-54-34327, JP-B-58-12577, JP-B-54-25957, JP-A-59-53836 (the term "JP-A" as used herein means an "unexamined published Japanese patent application"), JP-A-59-71048, JP-A-60-159743, JP-A-60-258539, JP-A-01-152449, JP-A-02-199403 and JP-A-02-199404, and cellulose derivatives containing carboxyl groups in their side chains.

When the above described polymers are used as binder resins, alkali-soluble groups, such as carboxyl groups, are still present in the areas remaining after development (i.e., the areas insoluble in an aqueous alkaline solution, e.g., the areas which have become resistant to an alkaline developer by reaction with a polyfunctional monomer, a cross-linking agent, a binder containing cross-linking groups or the like). Accordingly, the resistance of the remaining areas to an aqueous alkaline solution is insufficient when alkali treatment is carried out for a longer time or when the aqueous alkaline solution has a pH that is higher than that of the developer. However, if the content of alkali-soluble groups in a binder resin is reduced in order to enhance the alkali resistance of the remaining areas, the developability of the resulting binder resin in an aqueous alkaline solution is reduced. Therefore, it is difficult for conventional alkali-soluble resins to provide both good developability in an aqueous alkaline solution and a high level of alkali resistance in the remaining areas after development.

A photosensitive resin composition capable of providing both alkali developability as described above and a high level of alkali resistance in the areas remaining after development is well adapted for use as a protective layer of a color filter.

A color filter is one of the important parts of a liquid crystal display panel, and various performance items are required thereof. In particular, heat resistance and chemical resistance are very important when a color filter is used in an STN (Super Twisted Nematic) liquid crystal display panel or a FLC (Ferroelectric Liquid Crystal) display panel. This is because a transparent conductive layer is formed on the color filter and subsequently shaped into a transparent electrode pattern.

More specifically, the liquid crystal display panel described above has a multicolor picture-element layer on a transparent substrate which is generally made of glass. The multicolor picture-element layer is generally composed of red, green and blue picture elements which are alternately arranged in matrix form. The dimensions of each picture element, though they depend on the intended use, is on the order of 10–100 μm by 50–400 μm. The shape thereof is not necessarily a rectangle of the foregoing dimensions, but may be modified into the desired shape depending on the intended use. Furthermore, a black-colored or light-shielding black matrix may be formed so as to border each picture element and the peripheral part, if desired. Moreover, a protective layer is formed on the multicolor picture-element layer, to thereby obtain a color filter.

A transparent conductive layer is generally formed by sputtering ITO (indium tin oxide) on the protective layer. In the case of STN and ferroelectric liquid crystal display panels, the transparent conductive layer is further shaped into a transparent electrode pattern by photolithography, to thereby attach electrodes to the color filter. In addition, an oriented film is formed on the electrode-attached color filter. The thus prepared color filter and a separate transparent substrate which is provided with transparent electrodes and an oriented film are sealed, and a prescribed gap is kept therebetween by use of a spacer. Then, a liquid crystal is injected into the gap formed between the two substrates, to thereby produce a panel.

In a series of processes for forming the color filter of a liquid crystal display panel, it is necessary for the protective layer formed on the multicolor picture-element layer to have the following properties: (1) evenness, (2) sufficient hardness to prevent the spacer, which is used for securing the gap of a liquid crystal cell, from sinking therein, (3) resistance to various chemicals (including solvents for photoresist, acidic etching solutions, strongly alkaline resist stripping solutions, solvents for the coating solution of an oriented film, and the like) used in photolithographic operations performed on a transparent conductive layer, (4) transparency in the visible region as well as no fog and no turbidity, (5) excellent adhesion not only to a multicolor picture-element layer but also to a substrate, because in some cases the protective layer is provided directly on a substrate having no multicolor picture elements thereon, and (6) photosensitivity to enable the protective layer to be patterned by development (that is, the properties of a photosensitive resin) for the reason that only unnecessary areas (e.g., the areas on the scribe line) of the protective layer can be removed from the transparent substrate in high accuracy.

Examples of known light-sensitive materials which can serve as a protective layer when provided on a multicolor layer by a coating method or the like, exposed to light and then developed, include the UV curable resins described in JP-A-57-42009 and JP-A-60-244932, the vinylcarbonyl group containing polymers described in JP-A-59-7317, the photosensitive resins composed of PVA and sensitizers described in JP-A-59-184325, the gum-resin described in JP-A-60-42704, and the photosensitive resin composition obtained by removing the pigment from the pigment-dispersed photosensitive resin composition applied to the colored layer in JP-A-02-191901.

The protective layer is most desirably developable with an alkaline aqueous solution. This is advantageous in health and public hazard counter-measures. Furthermore, the protective layer desirably provides still greater alkali resistance when cured through the processes of exposure, development and heat treatment. This type of desirable protective layer can be obtained by using the compositions described, e.g., in JP-A-03-126950, JP-A-52-132091, JP-B-04-20923, JP-A-05-265208, Japanese Patent Application Nos. 5-152278, 5-202272, 6-1769 and 6-1766, etc.

In addition, light-sensitive materials comprising the combination of the resins used in the above-cited compositions with naphthoquinonediazide compounds as a sensitizer are disclosed, e.g., in JP-A-06-14888 and JP-A-04-347858.

All the resins used in the above-cited compositions are resins containing half-amide group obtained by reacting a maleic or itaconic anhydride copolymer with amines. However, it is hard to polymerize maleic or itaconic anhydride alone, as shown by the copolymerization reactivity ratios and other factors in *Polymer Handbook II,* 3rd Edition, page 153, compiled by J. Brandrup and H. Immergut, published by John Wiley & Sons. Inc. (1989). Also, maleic or itaconic anhydride and other monomers on the whole are not easily copolymerized, except that such monomers can readily copolymerize with a particular monomer such as styrene, vinyl acetate or the like to form an alternate copolymer. Therefore, it is difficult to easily produce a resin having the desired properties (including alkali developability, alkali resistance, and strong physical properties of the film before and after exposure) by controlling the compositional ratio between maleic or itaconic anhydride and other monomers.

Other resins having half-amido groups include known polyamic acid resins obtained by a polyaddition reaction between tetracarboxylic acid anhydrides and diamine compounds. However, the solubilities of these resins are difficult to control. The solubilities thereof are also very low, with the exception of special solvents having high polarity, such as NMP (N-methylpyrrolidone). Accordingly, these resins have a limited range of use.

Other resins having half-amido groups and which are resins comparable to the resins of the present invention are disclosed in JP-A-60-218662. However, these resins having half-amido groups are used as one component of a toner-dispersed liquid developer for electrostatic photography, and there is no description of their application to a photosensitive resin composition.

Furthermore, JP-A-01-197753, JP-A-62-279333, JP-A-62-136644, JP-A-62-5238, JP-A-61-252544, JP-A-61-57943, JP-A-61-177451 etc., describe resins containing half-amido groups. In any of these resins, however, the half-amido groups are contained as part of the skeleton of a dye precursor used for a silver halide photosensitive material. Therefore, the above-cited references are silent regarding alkali developability, the alkali resistance acquired after heating due to the presence of half-amido groups in these resins, and application of these resins to photosensitive resin compositions.

Such being the case, photosensitive resin compositions which are soluble in an aqueous alkaline solution, which can acquire sufficiently high alkali resistance after heating, and which possess excellent solubility, production suitability and chemical resistance have not hitherto been known.

SUMMARY OF THE INVENTION

Therefore, a first object of the present invention is to provide a photosensitive resin composition which is soluble in an alkaline solution and which, ensures sufficient alkali resistance after curing, and not only has excellent solubility and production suitability but also high chemical resistance.

A second object of the present invention is to provide a photosensitive resin composition which has excellent alkali developability and can form a protective layer (OC layer) having all of the properties required thereof, that is, 1) evenness, 2) hardness, 3) chemical resistance, 4) transparency, 5) adhesion to a substrate, and 6) capability for forming thereon a transparent conductive layer; and, more particularly, to provide a photosensitive resin constituting the composition having all of the above-described properties.

A third object of the present invention is to provide a method of producing a color filter, especially useful for a liquid crystal display panel, which has thereon a protective layer composed of the aforesaid photosensitive resin composition and that has been formed using a coating method or transfer method.

As a result of extensive studies, we have discovered that the above-described objects of the present invention are attained with a photosensitive resin composition comprising a resin which contains at least one repeating unit represented by the following general formulae (I) and/or (II), to thereby achieve the present invention:

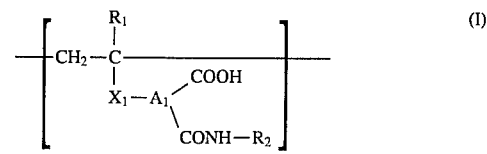

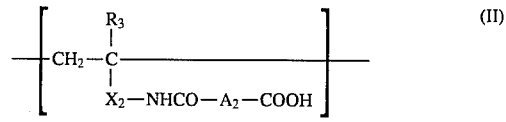

wherein $R_1$ represents a hydrogen atom or a methyl group; $R_2$ represents an alkyl group having 1 to 12 carbon atoms, an aralkyl group having 7 to 16 carbon atoms or an aryl group having 6 to 18 carbon atoms, and each of the alkyl, aralkyl and aryl groups may be branched and may be substituted with an alkyl group having 1 to 4 carbon atoms, an alkoxy group having 1 to 6 carbon atoms, an aryl group having 6 to 10 carbon atoms, an aralkyl group having 7 to 12 carbon atoms, a halogen atom or a combination of two or more thereof; $R_3$ represents a hydrogen atom or a methyl group; $X_1$ represents a single bond, —COO—, —OCO—, —CONR$_5$—, —COO—R$_6$— or —CONR$_7$—R$_8$—; $X_2$ represents a single bond, —COO—, —OCO—, —CONR$_9$—, —COO—R$_{10}$— or —CONR$_{11}$—R$_{12}$—; $A_1$ represents a trivalent organic group which can form an imide ring by a ring closure reaction with COOH and CONH—R$_2$; $A_2$ represents a divalent organic group which can form an imide ring by a ring closure reaction with COOH and NHCO; $R_5$, $R_7$, $R_9$ and $R_{11}$ each represents a hydrogen atom, an alkyl group having 1 to 12 carbon atoms, an aralkyl group having 7 to 16 carbon atoms, or an aryl group having 6 to 18 carbon atoms, and each of the alkyl, aralkyl and aryl groups may be branched and may be substituted with an alkyl group having 1 to 4 carbon atoms, an alkoxy group having 1 to 6 carbon atoms, an aryl group having 6 to 10 carbon atoms, an aralkyl group having 7 to 12 carbon atoms, a hydroxyl group, a halogen atom or a combination of two or more thereof; $R_6$, $R_8$, $R_{10}$ and $R_{12}$ each represents a hydrogen atom, an alkylene group having 1 to 10 carbon atoms, an arylene having 6 to 10 carbon atoms or an aralkylene group having 7 to 20 carbon atoms, and each of the alkylene, arylene and aralkylene groups may be branched, the carbon chain of each group may be interposed by a linkage group selected from the group consisting of —O—, —S—, —OCO—, —COO—, —CONH—, —NHCO—, —SO$_2$—, —SO$_2$NH—, —NHSO$_2$— and combinations of two or more of these linkage groups, and each group may be substituted with an alkyl group having 1 to 4 carbon atoms, an alkoxy group having 1 to 6 carbon atoms, an aryl group having 6 to 10 carbon atoms, an aralkyl group having 7 to 12 carbon atoms, a halogen atom or a combination of two or more thereof.

DETAILED DESCRIPTION OF THE INVENTION

The resin for use in the present invention which comprises at least one repeating unit represented by the foregoing general formulae (I) and (II) can be obtained, e.g., by polymerizing monomers represented by the following general formulae (III) and/or (IV):

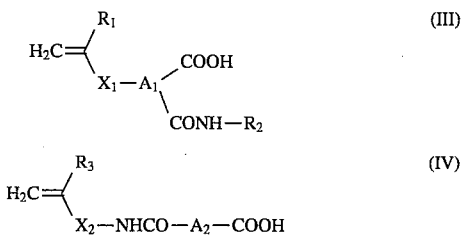

wherein $R_1$, $R_2$, $R_3$, $X_1$, $X_2$, $A_1$ and $A_2$ have the same meanings as in general formulae (I) and (II), respectively.

Preferred examples of the group represented by $R_2$ include methyl, ethyl, propyl, i-propyl, butyl, t-butyl, sec-butyl, pentyl, hexyl, cyclohexyl, heptyl, octyl, 2-ethylhexyl, lauryl, benzyl, phenetyl, phenyl, tolyl, octylphenyl, methoxyphenyl, 4-chlorophenyl, 1-naphthyl, methoxymethyl, 2-methoxyethyl, 2-ethoxyethyl, 3-methoxypropyl, 2-butoxyethyl, 2-cyclohexyloxyethyl, 3-ethoxypropyl, 3-propoxypropyl, 3-isopropoxypropyl, adamantyl etc.

Preferred examples of the groups represented by $X_1$ and $X_2$ include a single bond, —COO—, —OCO—, —CONH—, —CONMe—, —CONPh—, —CON(CH$_2$CH$_2$OMe)—, —COO—Z—, —COO—Z—OCO—, —COO—Z—CO—, —COO—Z—O—, —COO—Z—S—, —CONH—Z—, —CONH—Z—OCO—, —CONH—Z—CO—, —CONH—Z—O—, —CONH—Z—S—, —CONMe—Z—, —CONMe—Z—OCO—, —CONHMe—Z—O— etc., wherein Z represents an alkylene group such as methylene, ethylene, etc., a branched alkylene group such as methylethylene, an ether linkage-containing alkylene group such as polyethylene oxide, polypropylene oxide, etc., an ether linkage-containing branched alkylene group, a phenylene group, and arylene and aralkylene groups as illustrated below:

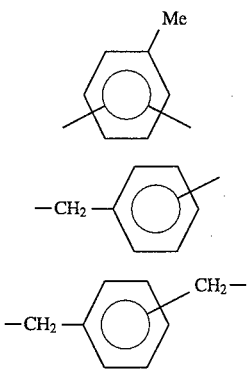

Preferred examples of the group represented by $A_1$ include the groups represented by the following formulae (where $X_1$ is as defined above):

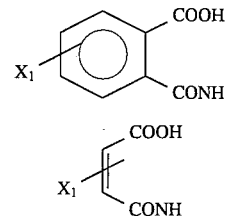

Preferred examples of the group represented by $A_2$ include ethylene, propylene, —CH=CH— and the groups illustrated below:

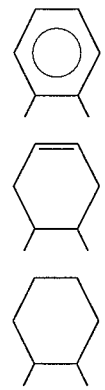

Specific examples of monomers represented by general formulae (III) and (IV) include the compounds illustrated below, wherein $R_1$ and $R_3$ each represents a hydrogen atom or a methyl group:

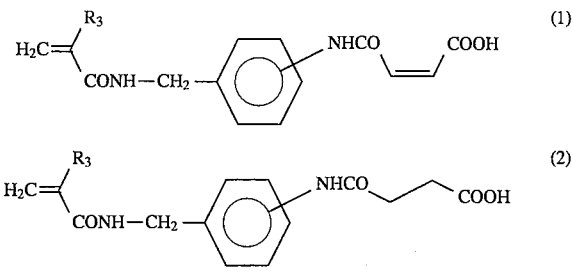

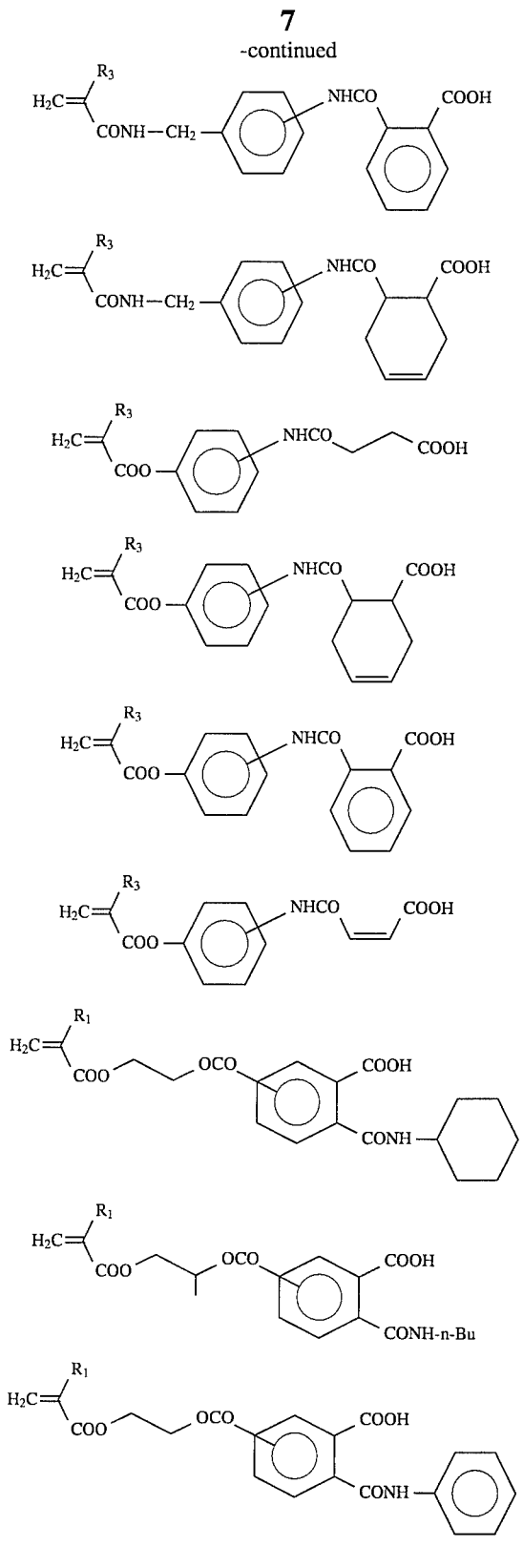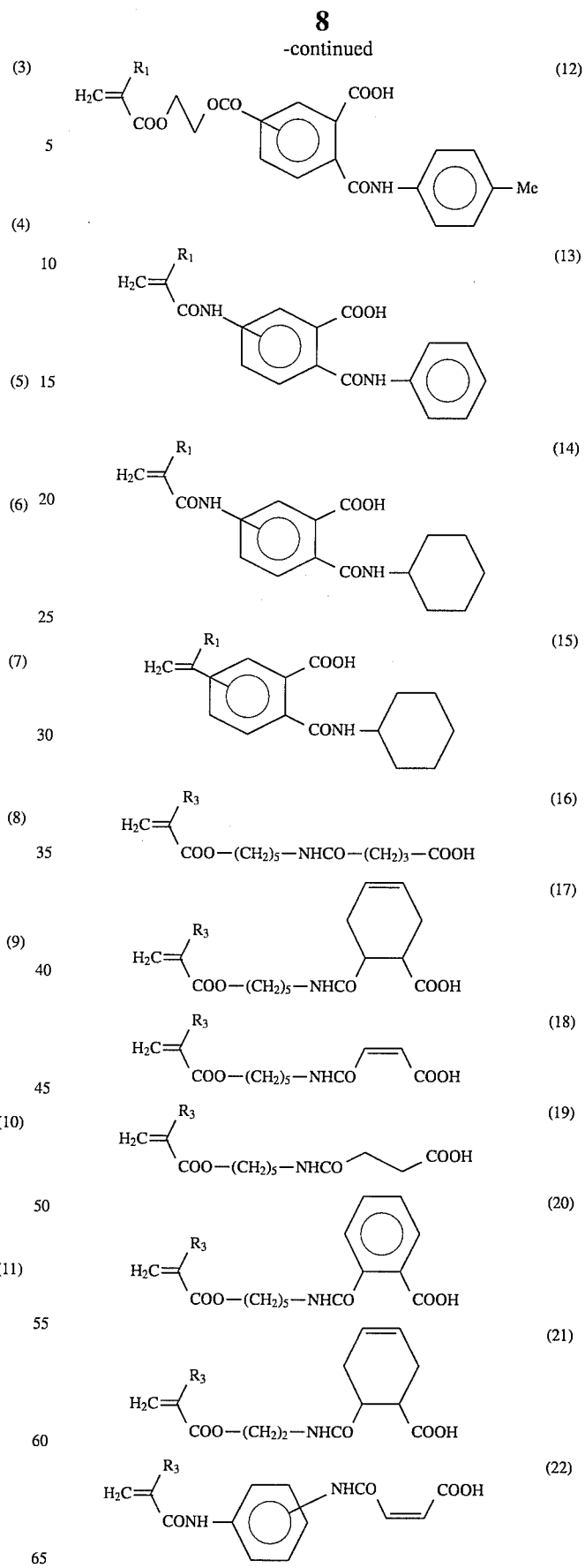

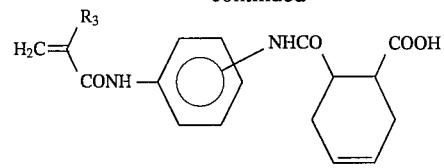

(23)

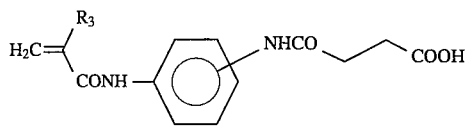

(24)

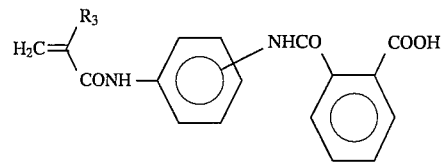

(25)

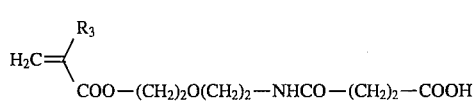

(26)

$$H_2C=\overset{R_3}{\underset{COO-(CH_2)_2O(CH_2)_2-NHCO-(CH_2)_2-COOH}{|}}$$

These monomers may be copolymerized with other monomers that can be copolymerized therewith as long as the copolymerized monomer does not impair the performance of the resulting resin.

The molar content of the repeating units represented by formula (I) and (II) in the resin for use in the present invention is generally from 10 to 100%, preferably from 15 to 80%, and particularly preferably from 15 to 50%.

Examples of the copolymerizable monomer include compounds containing one polymerizing unsaturated bond in a molecule, such as (meth)acrylic acid esters, (meth)acrylamides, allyl compounds, vinyl ethers, vinyl esters, styrenes, crotonic acid esters, etc. Specific examples of these compounds include(meth)acrylic acid esters such as unsubstituted and substituted alkyl(meth)acrylates [e.g., methyl(meth)acrylate, ethyl(meth)acrylate, propyl(meth)acrylate, isopropyl(meth)acrylate, butyl(meth)acrylate, amyl(meth)acrylate, hexyl(meth)acrylate, cyclohexyl(meth)acrylate, ethylhexyl(meth)acrylate, octyl(meth)acrylate, t-octyl(meth)acrylate, chloroethyl(meth)acrylate, allyl(meth)acrylate, 2-hydroxyethyl(meth)acrylate, 2-hydroxypropyl(meth)acrylate, 4-hydroxybutyl(meth)acrylate, 2,2-dimethyl-3-hydroxypropyl(meth)acrylate, 5-hydroxypentyl(meth)acrylate, trimethylolpropane mono(meth)acrylate, pentaerythritol mono(meth)acrylate, benzyl(meth)acrylate, methoxybenzyl(meth)acrylate, chlorobenzyl(meth)acrylate, furfuryl(meth)acrylate, tetrahydrofurfuryl(meth)acrylate, phenoxyethyl(meth)acrylate, etc.], aryl(meth)acrylates [e.g., phenyl(meth)acrylate, cresyl(meth)acrylate, naphthyl(meth)acrylate, etc.], (meth)acrylic acid amides [e.g., (meth)acrylamide, an N-alkyl(meth)acrylamide (the alkyl group of which is, e.g., methyl, ethyl, propyl, butyl, t-butyl, heptyl, octyl, ethylhexyl, cyclohexyl, hydroxyethyl, benzyl or the like), an N-aryl(meth)acrylamide (the aryl group of which is, e.g., phenyl, tolyl, nitrophenyl, naphthyl, hydroxyphenyl or the like), an N,N-dialkyl(meth)acrylamide (the alkyl groups of which are, e.g., methyl, ethyl, butyl, isobutyl, ethylhexyl, cyclohexyl or the like), an N,N-diaryl(meth)acrylamide (the aryl groups of which are, e.g., phenyl or the like), N-methyl-N-phenyl(meth)acrylamide, N-hydroxyethyl-N-methyl(meth)acrylamide, N-2-acetamidoethyl-N-acetyl(meth)acrylamide, N-phenylsulfonyl(meth)acrylamide, N-methylphenylsulfonyl(meth)acrylamide, etc.], allyl compounds [e.g., aryl esters, such as allyl acetate, allyl caproate, allyl caprylate, allyl laurate, allyl palmitate, allyl stearate, alkyl benzoate, allyl acetoacetate, allyl lactate, etc., allyloxyethanol, etc.], vinyl ethers [e.g., an alkyl vinyl ether (the alkyl group of which is, e.g., hexyl, octyl, decyl, ethylhexyl, methoxyethyl, ethoxyethyl, chloroethyl, 1-methyl-2,2-dimethylpropyl, 2-ethylbutyl, hydroxyethyl, hydroxyethoxyethyl, dimethylaminoethyl, diethylaminoethyl, butylaminoethyl, benzyl, tetrahydrofurfuryl, etc.), a vinyl aryl ether (the aryl group of which is, e.g., phenyl, tolyl, chlorophenyl, 2,4-dichlorophenyl, naphtyl, anthranyl, etc.) and the like], vinyl esters [e.g., vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-β-phenylbutyrate, vinyl cyclohexylcarboxylate, vinyl benzoate, vinyl salicylate, vinyl chlorobenzoate, vinyl tetrachlorobenzoate, vinyl naphthoate, etc.], styrenes [e.g., styrene, an alkylstyrene such as methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene, etc., an alkoxystyrene such as methoxystyrene, 4-methoxy-3-methylstyrene, dimethoxystyrene, etc., a halogenostyrene such as chlorostyrene, dichlorostyrene, trichlorostyrene, tetrachlorostyrene, pentachlorostyrene, boromostyrene, dibromostyrene, iodostyrene, fluorostyrene, trifluorostyrene, 2-bromo-4-trifluoromethylstyrene, 4-fluoro-3-trifluoromethylstyrene, etc., and the like], crotonic acid esters [e.g., an alkyl crotonate such as butyl crotonate, hexyl crotonate, glycerin monocrotonate, etc.], dialkyl itaconates [e.g., dimethyl itaconate, diethyl itaconate, dibutyl itaconate, etc.], dialkyl maleates or fumarates [e.g., dimethyl maleate, dibutyl fumarate, etc.], and (meth)acrylonitrile.

Furthermore, the foregoing monomers which can constitute the resin of the present invention can be copolymerized with an acidic group-containing monomer as long as alkali resistance is not impaired by the copolymerization. Specific examples of such an acidic group-containing monomer include acrylic acid, methacrylic acid, itaconic acid, crotonic acid, maleic acid, vinylbenzoic acid, cinnamic acid, vinylbenzenesulfonic acid, 2-(meth)acrylamido-2-methylpropanesulfonic acid, N-methylsulfonyl(meth)acrylamide, N-ethylsulfonyl(meth)acrylamide, N-phenylsulfonyl(meth)acrylamide, N-p-methylphenylsulfonyl(meth)acrylamide, and maleimide.

Examples of resins particularly preferred as the resins of the present invention which are prepared using the compounds as described above and comprise the repeating units represented by the foregoing general formulae (I) or (II), include those made of a copolymer of the compound of formula (9) and benzylmethacrylate, a copolymer of the compound of formula (9) and styrene, a copolymer of the compound of formula (9), methylmethacrylate and ethylacrylate, a copolymer of the compound of formula (19) and benzylmethacrylate, a copolymer of the compound of formula (20) and benzylmethacrylate, a copolymer of the compound of formula (23) and benzylmethacrylate, and a copolymer of the compound of formula (25) and benzylmethacrylate.

These resins for use in the present invention can be prepared by vinyl-polymerization method, which is commonly employed. For example, these resins can be obtained by polymerizing or copolymerizing the above described monomers in an appropriate amount of solvent or without a solvent in the presence of a known polymerization initiator.

Examples of the solvent include hydrocarbon solvents (e.g., toluene, xylene, cyclohexane), halogenated hydrocarbon solvents (e.g., methyl chloride, dichloromethane, chloroform, 1,2-dichloroethane), ketone solvents (e.g., acetone, methyl ethyl ketone, cyclohexanone), ester solvents (e.g., methyl acetate, ethyl acetate, propyl acetate, ethylene glycol monomethyl ether acetate, ethylene glycol monoethyl ether acetate, diethylene glycol monomethyl ether acetate, diethylene glycol monoethyl ether acetate, propylene glycol monomethyl ether acetate), alcohol solvents (e.g., methanol, ethanol, propanol, isopropanol, methoxy propanol) and water. These solvents may be used alone or in combination of two or more kinds thereof. Examples of the polymerization initiator include azo type initiators such as 2,2'-azobisisobutyronitrile, 2,2'-azobis(2,4-dimethyl valeronitrile) and peroxide type initiators such as benzoyl peroxide. A temperature for the polymerization depends on the kinds of a solvent and a polymerization initiator used, but the temperature is generally in the rage of from 50° to 100° C.

The resin of the present invention preferably has a weight average molecular weight ranging from 500 to 30,000, particularly preferably from 700 to 20,000. A copolymer whose weight average molecular weight is lower than 500 is difficult to produce, while a copolymer having a weight average molecular weight higher than 30,000 has inferior alkali developability of the light-sensitive layer and also inferior developer resistance. That is, the low in alkali developability requires a long-term soak in a developer. As a result, a protective layer comprising the resin tends to swell even in the exposed areas thereof such that it is difficult to form an image of good quality.

The content of the resin containing at least one repeating unit represented by formula (I) and (II) in the photosensitive resin composition of the present invention preferably ranges from 20 to 90% by weight, particularly preferably from 30 to 70% by weight, based on the solids content of the composition. When the content is lower than 20% by weight, the photosensitive layer cannot be handled easily because of increased tackiness; while when the content is increased beyond 90% by weight, the exposed areas of the composition exhibit inferior resistance to an alkali developer.

The photosensitive resin composition of the present invention is obtained by the combined use of the resin as specified above and a photosensitive compound or photosensitive composition. Examples of the photosensitive compound or composition include a positively working photosensitive compound or composition such as the combination of an addition polymerizable monomer having an ethylenically unsaturated double bond with a photopolymerization initiator, a compound containing a plurality of cross-linking groups such as cinnamoyl group, meleimido group or the like, and a diazonium salt, and a positively working photosensitive compound such as an o-quinonediazide compound.

The addition polymerizable monomer having an ethylenically unsaturated double bond, can be used alone or in combination with other monomers. Specific examples of the addition polymerizable monomer include t-butyl(meth)acrylate, ethylene glycol di(meth)acrylate, 2-hydroxypropyl(meth)acrylate, triethylene glycol di(meth)acrylate, trimethylolpropane tri(meth)acrylate, 2-ethyl-2-butyl propanediol di(meth)acrylate, pentaerythritol tri(meth)acrylate, pentaerythritol tetra(meth)acrylate, dipentaerythritol hexa(meth)acrylate, dipentaerythritol penta(meth)acrylate, polyoxyethylated trimethylolpropane tri(meth)acrylate, tris(2-(meth)acryloyloxyethyl)isocyanurate, 1,4-diisopropenylbenzene, 1,4-dihydroxybenzene di(meth)acrylate, decamethylene glycol di(meth)acrylate, styrene, diallyl fumarate, triallyl trimellitate, lauryl(meth)acrylate, (meth)acrylamide, and xylylenebis(meth)acrylamide. In addition, the products obtained by the reaction of a hydroxyl group-containing compound, such as 2-hydroxyethyl(meth)acrylate, 2-hydroxypropyl(meth)acrylate, polyethylene glycol mono(meth)acrylate or the like, with a diisocyanate such as hexamethylene diisocyanate, toluene-diisocyanate, xylene diisocyanate or the like, can be used as the addition polymerizable monomer. Of the monomers described above, pentaerythritol tetraacrylate, dipentaerythritol hexaacrylate, dipentaerythritol pentaacrylate and tris(2-acryloyloxyethyl)isocyanurate are preferred.

The total content of the addition polymerizable monomers in the photosensitive resin composition ranges from 10 to 80% by weight, particularly preferably from 30 to 70% by weight, based on the solids content of the composition. When the content is lower than 10% by weight, the exposed areas of the composition exhibit inferior resistance to an alkali developer; while when the content is increased beyond 80% by weight, the photosensitive layer exhibits an increased tackiness so that it is not easy to handle.

Useful photopolymerization initiators or photopolymerization initiating systems for combination with the aforementioned ethylenically unsaturated double bond-containing addition polymerizable monomers include substantially all known initiators and initiating systems. Examples thereof include p-methoxyphenyl-2,4-bis(trichloromethyl)-s-triazine, 2-(p-butoxystyryl)-5-trichloromethyl-1,3,4-oxadiazole, 9-phenylacridine, 9,10-dimethylbenzophenazine, benzophenone/Michler's ketone, hexaarylbiimidazole/mercaptobenzimidazole, benzyldimethylketal, thioxanthone/amine, etc. In particular, trihalomethyl group-containing compounds such as 2-(p-butoxystyryl)-5-trichloromethyl-1,3,4-oxadiazole are preferred.

The photopolymerization initiator is added in an amount of from 0.1 to 20% by weight, particularly preferably from 0.5 to 5% by weight, based on the solids content of the composition. When the amount is less than 0.1% by weight, long exposure is required because of low efficiency in photocuring the composition; while when the amount is increased beyond 20% by weight, the resulting composition exhibits deteriorated light transmission in the ultraviolet and visible regions, and it is unsuitable for the protective layer of a color filter.

Useful diazonium salts include the diazonium compounds described in U.S. Pat. Nos. 3,867,147 and 2,632,703. In particular, diazo resins represented by the condensates of aromatic diazonium salts and active carbonyl-containing compounds (e.g., formaldehyde) are preferably used. Furthermore, the compounds described in JP-A-58-27141 are examples thereof.

These diazonium salts may be used alone or as a mixture of two or more thereof, and the content thereof based on the solids of the photosensitive resin composition is preferably in the range of 1 to 50% by weight, and more preferably in the range of 3 to 20% by weight.

On the other hand, high molecular photosensitve compounds can be used. Examples thereof include compounds obtained by introducing photosensitive groups, such as cinnamoyl group, maleimido group, etc., into the foregoing polymers. Specific examples of such high molecular compounds include those described, e.g., in JP-A-02-157762, and British Patents 1,112,277, 1,313,390, 1,341,004 and 1,377,747. Also, the compounds obtained by copolymerizing these monomers containing photosensitive functional groups as described above and the monomer represented by the foregoing general formula (III) or (IV) can be used.

Of the o-quinonediazide compounds, o-naphthoquinonediazide compounds are preferred. Specific examples thereof include the compounds described, e.g., in JP-B-43-28403, U.S. Pat. Nos. 3,046,120 and 3,188,210, JP-A-47-5303, JP-A-48-63802, JP-A-49-38701, JP-A-48-13354, JP-A-49-17481 and JP-A-02-167550.

Those o-quinonediazide compounds may be used alone or as a mixture of two or more thereof, and the content thereof based on the solids of the photosensitive resin composition ranges preferably from 10 to 50% by weight, more preferably from 20 to 40% by weight.

As described above, it is possible to use various photosensitive compounds or compositions. However, the combinations of an ethylenically unsaturated double bond-containing addition polymerizable monomer and a photopolymerization initiator are particularly preferred.

Furthermore, known additives, e.g., a plasticizer, a filler, a stabilizer and the like can be added to the photosensitive resin composition of the present invention. When the composition is used for purposes other than the protective layer of a color filter, pigments, dyes or the like can also be added.

The photosensitive resin composition of the present invention is well suited as a material for forming the protective layer of a color filter. More specifically, the present photosensitive resin composition is provided in a layer-form on a color filter having the aforementioned picture elements, and undergoes exposure, development and heating operations successively, to thereby form a protective layer. In order to provide the composition in the form of a layer, a known coating method, e.g., a spray coating method, a dip coating method or the like, or a method of forming a photosensitive resin composition layer on a temporary support and then transferring the layer can be employed.

The thickness of the protective layer is generally in the range of 0.1 to 50 μm, and particularly preferably in the range of 1 to 5 μm.

Useful supports for the color filter include a metallic support, a metal-veneered support, a glass plate, a ceramic plate and a synthetic resin-film. Furthermore, glass plates and synthetic resin films having good transparency and high dimensional stability are particularly preferred.

The photosensitive resin composition of the present invention can be used as a layer transfer material. More specifically, the photosensitive resin composition is provided in a layer-form temporary support, preferably a polyethylene terephthalate film, directly or through an oxygen impervious layer, a releasable layer, or both of them. A removable cover sheet made of a synthetic resin is generally laminated on the thus provided photodsensitive resin composition layer to protect from improper handling. Also, the present photosensitive resin composition is applicable to a layer structure having thereon a temporary support an alkali-soluble thermoplastic resin layer, an interlayer and a photosensitive resin composition layer, which are arranged in this order (as described in JP-A-05-173320).

The cover sheet described above is removed at the time the layer transfer material to be used, and the photosensitive resin composition layer is laminated on a permanent support, e.g., a support having thereon a multicolor layer having multicolor picture elements. Then, the temporary support is removed by delaminating between the releasable layer or oxygen impervious layer and the temporary support when the layer transfer material has the releasable layer or the oxygen impervious layer, or between the releasable layer and the oxygen impervious layer when the releasable layer, the layer transfer material has both the releasable layer and the oxygen impervious layer, or between the temporary support and the photosensitive resin composition layer when both the releasable layer and oxygen impervious layer are absent to thereby prepare a color filter. Furthermore, the photosensitive resin composition layer is subjected to exposure. In forming transparent electrodes on the color filter thus prepared, a protective layer provided on the multicolor picture-element layer is patterned by exposure through a mask and subsequent development, as in the production of an STN liquid crystal display. The development is effected by washing away the alkali soluble areas (unexposed areas in the case of using the combination of an ethylenically unsaturated double bond-containing addition polymerizable monomer with a photopolymerization initiator) with an appropriate alkali developer.

On the other hand, when a transparent conductive layer is formed all over the surface, as in the case of a TFT (Thin Film Transistor) liquid crystal display, a mask is not needed.

As a developer for the photosensitive resin composition of the present invention, a dilute aqueous solution of an alkaline substance is used. Furthermore, the solution may be admixed with a small amount of a water-miscible organic solvent.

Examples of the alkaline substance suitable for the developer include hydroxides of alkali metals (such as sodium hydroxide and potassium hydroxide), carbonates of alkali metals (such as sodium carbonate and potassium carbonate), hydrogen carbonates of alkali metals (such as sodium hydrogen carbonate and potassium hydrogen carbonate), silicates of alkali metals (such as sodium silicate and potassium silicate), metasilicates of alkali metals (such as sodium metasilicate and potassium metasilicate), triethanolamine, diethanolamine, monoethanolamine, morpholine, tetraalkylammonium hydroxides (such as tetramethylammonium hydroxide), and trisodium phosphate. The concentration of the alkaline substance preferably ranges from 0.01 to 30% by weight, and the pH of the developer is preferably in the range of 8 to 14.

Suitable examples of the water-miscible organic solvent include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, hexamethylphosphoramide, ethyl lactate, methyl lactate, ε-caprolactam and N-methylpyrrolidone. The concentration of the water-miscible organic solvent is preferably in the range of 0.1 to 30% by weight.

In addition, a known surfactant can be added to the developer. The concentration of the surfactant is preferably in the range of 0.01 to 10% by weight.

The developer can be used in the form of a bath or spray. In removing the alkali soluble parts of the photosensitive resin composition layer, means to rub off those parts with a rotating brush or a wet sponge in the developer may be used in combination. The temperature of the developer preferably ranges from ordinary room temperature to 40° C. After development, a washing step may be added.

After development, heat treatment is carried out. More specifically, alkali-insoluble parts on the substrate (the parts remaining as an image, e.g., the parts cross-linked and cured by photopolymerization in the case of the combination of an ethylenically unsaturated double bond-containing addition polymerizable monomer and a photopolymerization initiator) are heated in an electric furnace or oven, or irradiated with an infrared lamp. The heating temperature and time depend on the ingredients which constitute the photosensitive resin composition and the layer thickness. In general, heating over a period of from about 10 to about 60 minutes at a temperature ranging from about 120° C. to about 250° C. is desirable for imparting sufficient solvent resistance and alkali resistance.

On the thus formed protective layer is formed an ITO (indium tin oxide) layer is formed by a sputtering method. In shaping the ITO layer into transparent electrodes, a photoresist layer is formed on the ITO layer, an electrode pattern is printed on the photoresist layer, the printed photoresist layer is developed, the resulting bare part of the ITO layer is etched, and then the remaining photoresist is stripped off the ITO layer. Furthermore, an oriented film is formed on the thus patterned ITO layer by coating thereon an oriented film forming solution, e.g., an polyimide solution containing as a solvent a polar organic solvent such as N-methylpyrrolidone or γ-butyrolactone, drying the coated solution, and then subjecting it to an orientation treatment.

The photosensitive resin composition of the present invention is useful as a material for forming the protective layer of a color filter, regardless of the method adopted in the production of the color filter. In other words, the color filter may be produced by any of known methods, including a transfer method, a colored resist method, a dyeing method, a printing method, an electrodeposition method and the like.

The photosensitive resin composition of the present invention, as described above, is well suited for forming a protective layer on the multicolor picture-element layer of a color filter, but it should not be construed as being limited to such a use. Specifically, the present photosensitive resin composition is useful for many other purposes, e.g., as a colored resist for the formation of color filter picture elements, which comprises dyes or pigments and requires a high level of chemical resistance (as disclosed, e.g., in JP-A-298304), a soldering resist for a printed substrate (as disclosed, e.g., in JP-A-03-223856), a resist for nonelectrode plating (as disclosed e.g., in JP-A-03-223856), a protective film for electric elements, a interlayer insulation film and an adhesive (as disclosed, e.g., in JP-A-03-126950), and a spacer material.

The present invention will now be illustrated in more detail by reference to the following Examples. But, these examples should not be construed as limiting the invention in any way. In the following examples, all parts and percentages are by weight unless otherwise indicated.

SYNTHESIS EXAMPLE 1

Synthesis of p-Aminophenylmethacrylamide:

In 500 parts of tetrahydrofuran were dissolved 138.1 parts of p-nitroaniline and 111.3 parts of triethylamine. Thereto, a solution of 125.4 parts of methacrylic acid chloride in 100 parts of tetrahydrofuran was added dropwise over a 4-hour period as the resulting mixture was cooled with ice. After the conclusion of the addition, the reaction mixture was allowed to stand for 4 hours at room temperature in order to complete the reaction. The resulting solution was poured into 3,000 parts of ice-cold water. The thus deposited crystals were removed by filtering, washed with water, and dried to yield 273.5 parts of crude crystals of p-nitrophenylmethacrylamide.

The crude crystals thus obtained were dissolved in a mixture of 500 parts of ethanol and 500 parts of water, and admixed with 167.6 parts of iron. Thereto was further added a mixture of 10 parts of hydrochloric acid, 150 parts of ethanol and 150 parts of water. The resulting mixture was refluxed for 5 hours. After cooling, the ethanol was removed therefrom by distillation under reduced pressure, and the residue was poured into 15,000 parts of water containing 4.8 parts of NaOH. The thus deposited crystals were removed by filtering, washed with water, dried, and then recrystallized from a ethyl acetate/hexane mixture. Thus, 68 parts of p-aminophenylmethacrylamide was obtained.

SYNTHESIS EXAMPLE 2

Synthesis of m-Aminophenylmethacrylamide:

m-Aminophenylmethacrylamide was obtained in the same manner as in Synthesis Example 1, except that m-nitroaniline was used in place of p-nitroaniline.

SYNTHESIS EXAMPLE 3

In 50 parts of dimethylacetamide was dissolved 37.0 parts of phthalic anhydride. Thereto, a solution of 44.1 parts of p-aminophenylmethacrylamide in 150 parts of dimethylacetamide was added dropwise over a period of 2 hours as the resulting mixture was cooled with ice. Furthermore, the stirring was continued for 4 hours at room temperature. The resulting reaction mixture was poured into 1,500 parts of ice-cold water to precipitate crystals. Then, the crystals were removed by filtering, washed with water, dried, and further washed with chloroform. Thus, 74.1 parts of Compound of formula (25) (wherein $R_3$ is a methyl group and the substituent on the benzene ring is situated at the p-position) was obtained as light brown crystals.

SYNTHESIS EXAMPLE 4

Another Compound of formula (25) (wherein $R_3$ is a methyl group and the substituent on the benzene ring is situated at the m-position) was synthesized in the same manner as in Synthesis Example 3, except that m-aminophenylmethacrylamide was used in place of p-aminophenylmethacrylamide.

SYNTHESIS EXAMPLE 5

The compound of formula (23) (wherein $R_3$ is a methyl group and the substituent on the benzene ring is situated at the p-position) was synthesized in the same manner as in Synthesis Example 3, except that 38.0 parts of tetrahydrophthalic anhydride was used in place of 37.0 parts of phthalic anhydride.

SYNTHESIS EXAMPLE 6

Another Compound of formula (23) (wherein $R_3$ is a methyl group and the substituent on the benzene ring is situated at the m-position) was synthesized in the same manner as in Synthesis Example 3, except that m-aminophenylmethacrylamide was used in place of p-aminophenylmethacrylamide and also 38.0 parts of tetrahydrophthalic anhydride was used in place of 37.0 parts of phthalic anhydride.

SYNTHESIS EXAMPLE 7

In 150 parts of tetrahydrofuran was dissolved 51.6 parts of 5-aminopentanol, and thereto was added 74.1 parts of phthalic anhydride. In the resulting mixture, the reaction was run for one day at room temperature. The reaction solution thus obtained was admixed with 121.4 parts of triethylamine, and thereto was added dropwise 54.3 parts of acrylic acid chloride over a period of 3 hours as the resulting solution was cooled with ice. After the conclusion of the dropwise addition, the reaction was further continued for 4 hours at room temperature. The reaction mixture thus obtained was poured into 800 parts of ice-cold water, and the product was extracted with ethyl acetate, washed with water, and then dried. Further, the solvent was removed therefrom by distillation under reduced pressure to yield an orange-brown oily matter. This oily matter was purified by column chromatography on silica gel (developing solvent: a chloroform/MeOH mixture), to thereby obtain the compound of formula (20) (wherein $R_3$ is a hydrogen atom) as an orange-brown oily substance.

SYNTHESIS EXAMPLE 8

The compound of formula (19) (wherein $R_3$ is a hydrogen atom) was obtained in the same manner as in Synthesis Example 7, except that 50.1 parts of cinnamic anhydride was used in place of 74.1 parts of phthalic anhydride.

SYNTHESIS EXAMPLE 9

In 300 parts of benzene was dissolved 105.3 parts of trimellitic anhydride chloride. Thereto, a mixture of 58.1 parts of 2-hydroxyethylacrylate, 39.6 parts of pyridine and 100 parts of benzene was added dropwise over a period of 3 hours as the resulting admixture was cooled with ice. After the conclusion of the dropwise addition, the reaction was further continued for 4 hours at room temperature. Therefrom, an insoluble matter was removed by filtration with suction, and the solvent was distilled away under reduced pressure. The residue was dissolved in 200 parts of tetrahydrofuran, and thereto was added dropwise a solution of 41.7 parts of cyclohexylamine in 50 parts of tetrahydrofuran over a period of 2 hours as the resulting admixture was cooled with ice. After the dropwise addition, the reaction was further run for 4 hours at room temperature. Then, the resulting reaction mixture was poured into 500 parts of ice-cold water, and the product was extracted with chloroform, washed with water, and then dried. Furthermore, the solvent was removed therefrom by distillation under reduced pressure to yield a white oily matter. This matter was washed with benzene to yield 55.8 parts of Compound of formula (9) (wherein $R_1$ is a hydrogen atom, and both 3- and 4-positions are present as a mixture with respect to the substitution position on the benzene ring) as a white solid.

SYNTHESIS EXAMPLE 10

Another Compound of formula (9) (wherein $R_1$ is a methyl group, and both 3- and 4-positions are present as a mixture with respect to the substitution position on the benzene ring) was obtained in the same manner as in Synthesis Example 9, except that 65.1 parts of 2-hydroxyethylmethacrylate was used in place of 58.1 parts of 2-hydroxyethylacrylate.

SYNTHESIS EXAMPLE 11

The monomer obtained in Synthesis Example 9 in an amount of 21.0 parts (0.054 mole), benzylmethacrylate in an amount of 22.2 parts (0.126 mole) [the molar ratio of these two monomers=30/70]and dodecylmercaptane in an amount of 0.73 part were dissolved in 64.8 parts of methyl ethyl ketone. The resulting solution was admixed with 0.15 part of 2,2'-azobis(2,4-dimethylvaleronitrile), and heated at 70° C. for 2 hours with stirring in a stream of nitrogen. Furthermore, 0.25 part of 2,2'-azobis(2,4-dimethylvaleronitrile) was added thereto, and the heating was continued for 4 hours with stirring. From the thus obtained reaction mixture, 39.2 parts of the intended resin having half-amido groups in its side chains (Resin No. 1) Was precipitated with hexane.

The molar ratio between the constituent monomers was determined from the acid value of the resin thus obtained. As a result thereof, the value of 28/72 was obtained as the ratio of monomer obtained in Synthesis Example 9 to benzylacrylate. This value is nearly equal to the ratio between the prepared amounts of those monomers. Thus, these monomers have satisfactory copolymerizability, so that it was ease to adjust the ratio between the constituent monomers to the intended value.

SYNTHESIS EXAMPLES 12 TO 23

Resins having half-amido groups in their side chains (Resin Nos. 2 to 11) were synthesized in the same manner as in Synthesis Example 11, except that the monomers set forth in Table 1 were used as starting monomers, and resins having carboxyl groups (Resin No. 12 and 13) were prepared for comparison.

TABLE 1

| Resin No. | Starting Monomers | Ratio (by mole) | Weight average molecular weight |
|---|---|---|---|
| 1 | Monomer of Synthesis Example 9/Benzylmethacrylate | 30/70 | 3950 |
| 2 | Monomer of Synthesis Example 9/Benzylmethacrylate | 20/80 | 6270 |
| 3 | Monomer of Synthesis Example 9/Styrene | 30/70 | 1270 |
| 4 | Monomer of Synthesis Example 10/Benzylmethacrylate | 20/80 | 8180 |
| 5 | Monomer of Synthesis Example 7/Benzylmethacrylate | 20/80 | 4200 |
| 6 | Monomer of Synthesis Example 8/Benzylmethacrylate | 20/80 | 8320 |
| 7 | Monomer of Synthesis Example 3/Benzylmethacrylate | 20/80 | 6000 |
| 8 | Monomer of Synthesis Example 4/Benzylmethacrylate | 20/80 | 4690 |
| 9 | Monomer of Synthesis Example 5/Benzylmethacrylate | 20/80 | 7920 |
| 10 | Monomer of Synthesis Example 6/Benzylmethacrylate | 20/80 | 4600 |
| 11 | Monomer of Synthesis Example 6/Methylmethacrylate/Ethylacrylate | 20/40/40 | 5450 |
| 12 | Methacrylic acid/Benzylmethacrylate | 28/72 | 9800 |
| 13 | Methacrylic acid/Benzylmethacrylate | 15/85 | 8800 |

EXAMPLE 1

<Preparation of Coating Solution for Protective Layer>

The following ingredients were mixed to form a solution, and passed through a filter having a pore size of 0.2 μm to prepare a coating solution for a protective layer.

| | |
|---|---|
| 20 wt % Solution of Resin No. 1 obtained in Synthesis Example 11 (solvent: 1/1 by weight mixture of propylene glycol monomethyl ether acetate with propylene glycol monomethyl ether) | 68 parts |
| Dipentaerythritol hexaacrylate | 3.4 parts |
| Tris(acryloyloxyethyl)isocyanurate | 10.2 parts |
| 2-(4-Butoxystyryl)-5-trichloromethyl-1,3,4-oxadiazole | 0.65 part |
| Hydroquinone monomethyl ether | 0.007 part |
| Fluorine-containing surfactant, F177P (trade mark, a product of Dai-Nippon Ink & Chemicals, Inc.) | 0.002 part |

<Formation of Protective Layer>

To a multicolor layer composed of red (R), green (G) and blue (B) picture elements and formed on a 1.1 mm-thick glass substrate (dimensions: 350 mm×400 mm), the foregoing coating solution for forming a protective layer was applied with a spin coater, and dried. Thus, a 3 μm-thick photosensitive layer was formed as a protective layer. This layer was irradiated with 200 mJ/cm$^2$ of ultraviolet rays through a mask for printing the protective layer. Therein, an ultra high pressure mercury lamp aligner was used as the light source. The thus irradiated layer was developed by spraying thereon a 1% aqueous solution of sodium carbonate as a developer, and washed with water. Further, the substrate was placed in a 200° C. oven for 20 minutes to heat treat the protective layer, and then cooled.

An ITO film having a thickness of 0.2 μm was deposited on the thus formed protective layer using a sputtering technique, and a positive working photoresist film (FH2130, trade mark, a product of Fuji Hunt Electronics Technology Co., Ltd.) was formed on the ITO film. The photoresist film was exposed to light through an electrode pattern mask, and developed. Furthermore, the ITO layer was etched, and the remaining resist film was removed with a resist stripping solution (MS2001, trade mark, a product of Fuji Hunt Electronics Technology Co., Ltd.). Thus, ITO electrodes having no defects at all were obtained. Although an attempt was made to peel the electrodes off the ITO film by means of an adhesive tape, none of the electrodes came off. Furthermore, a coating solution for an oriented film (a solution of a polyimide resin in an N-methylpyrrolidone/γ-butyrolactone mixture) was applied to the ITO electrodes by means of a spin coater, and dried. Thus, an oriented film was obtained without any swelling. The pencil hardness of the protective layer thus obtained was 5H.

Evaluation results of other criteria are shown in Table 2.

EXAMPLES 2 TO 11, AND COMPARATIVE EXAMPLES 1 AND 2

Coating solutions for forming protective layers were prepared in the same manner as in Example 1, except that Resin Nos. 2 to 13 were used in place of Resin No. 1, respectively. Each of these solutions was coated on the same glass substrate as used in Example 1, and dried to provide a layer having a thickness of 3 μm. The layer was exposed, developed (with a 1% aqueous solution of sodium carbonate at 30° C.), and then heated under the same conditions as in Example 1.

The methods adopted in evaluating the properties of each sample are described below:

(1) Developability

A photosensitive layer coated on the glass substrate using a spin coater in a thickness of 3 μm is soaked in a 1% aqueous solution of sodium carbonate for 1 minute at 30° C. The developability of the layer is evaluated by ascertaining whether or not the layer is dissolved by that treatment.

(2) Developer Resistance

A photosensitive layer coated on the glass substrate using a spin coater in a thickness of 3 μm is exposed to light at an intensity of 200 mJ/cm$^2$ through a mask to form rectangular picture elements having dimensions of 80 μm×300 μm, and then soaked in a 1% aqueous solution of sodium carbonate for 1 minute at 30° C. The developer resistance of the layer is evaluated by ascertaining on whether or not the exposed areas of the layer is remain adhered to the substrate.

(3) Evenness

A photosensitive layer is formed in a thickness of 3 μm on a 2 μm-thick multicolor layer (having an unevenness of 2 μm) provided on a glass substrate, and then exposed to light (200 mJ/cm$^2$), developed and heated (200° C., 60 minutes). The thus formed protective layer is examined for surface unevenness by means of a film thickness gauge. If the unevenness thus measured is less than ±0.5 μm, the evenness of the layer is judged to be good, while if it is greater than ±0.5 μm, the layer is judged to have bad evenness.

(4) Hardness

A photosensitive layer is formed in a thickness of 3 μm on a glass substrate, exposed to light (200 mJ/cm$^2$), developed, and then heated (200° C., 60 minutes). The hardness of the thus processed layer is evaluated in accordance with the pencil hardness test defined by JIS K5400.

(5) Alkali Resistance

A photosensitive layer is formed in a thickness of 3 μm on a glass substrate, exposed to light (200 mJ/cm$^2$), developed, and then heated (200° C., 60 minutes). The alkali resistance of the thus processed layer is evaluated by ascertaining whether or not creases and turbidity are generated in the layer surface by treatment in a 5% water solution of KOH for 30 minutes at 50° C.

(6) Transmission of Light

A photosensitive layer for forming a protective layer is formed in a thickness of 3 μm on a glass substrate, blanket exposed to light (200 mJ/cm$^2$), developed, and then heated (200° C., 60 minutes). When the thus processed layer has a clear surface, the transparency thereof is judged to be good; while if it has a cloudy surface, the layers judged to have poor transparency thereof.

(7) Adhesion to Substrate

A photosensitive layer for forming a protective layer is formed in a thickness of 3 μm on a glass substrate, blanket exposed to light (200 mJ/cm$^2$), developed, and then heated (200° C., 60 minutes). Furthermore, the thus processed layer is subjected to a cross-cut adhesion test wherein peeling is attempted using a Mylar tape. When none of 100 crosscut squares is peeled off in the test, the adhesion of the layer is judged to be good; while when one or more among the 100 crosscut squares is peeled off, the layer is judged to have poor adhesion.

(8) Capability for Forming a Transparent Conductive Layer

A photosensitive layer for forming a protective layer is formed in a thickness of 3 μm on a glass substrate, blanket exposed to light (200 mJ/cm$^2$), developed, and then heated (200° C., 60 minutes). A thin film of indium tin oxide (tin oxide content: 6% by weight) is evaporated thereon using a high-frequency sputtering apparatus (made by Anelva Corporation) under conditions of an evaporation time of 10 minutes, a voltage of 800 V, an electric current of 1.8 A, a power of 270 W and an argon pressure of 5×10$^{-4}$ Torr. The surface appearance of the transparent conductive layer thus formed is observed under a microscope, and the adhesion test using a tape for peeling is carried out, to thereby evaluate the capability for forming a transparent conductive layer. More specifically, when the surface of the transparent conductive layer is even and uniform, and does not exhibit peeling or other difficulties in the adhesion test, the capability for forming a transparent conductive layer is judged to be good; while when the transparent conductive layer generates creases and cracks at the surface or is removed in the adhesion test, the capability thereof is judged to be bad.

The evaluation results of the above-described criteria are shown in Table 2.

TABLE 2

| Example No. | Polymer No. | Developability | Developer Resistance | Evenness | Hardness | Alkali Resistance | Transmission of Light | Adhesion to Substrate After Development | Adhesion to Substrate After Heating | Capability for Forming Conductive Layer |
| --- | --- | --- | --- | --- | --- | --- | --- | --- | --- | --- |
| 1 | 1 | good | good | good | 5H | good | good | good | good | good |
| 2 | 2 | good | good | good | 5H | good | good | good | good | good |
| 3 | 3 | good | good | good | 5H | good | good | good | good | good |
| 4 | 4 | good | good | good | 5H | good | good | good | good | good |
| 5 | 5 | good | good | good | 5H | good | good | good | good | good |
| 6 | 6 | good | good | good | 5H | good | good | good | good | good |
| 7 | 7 | good | good | good | 5H | good | good | good | good | good |
| 8 | 8 | good | good | good | 5H | good | good | good | good | good |
| 9 | 9 | good | good | good | 5H | good | good | good | good | good |
| 10 | 10 | good | good | good | 5H | good | good | good | good | good |
| 11 | 11 | good | good | good | 5H | good | good | good | good | good |
| Compar. Ex. 1 | 12 | good | good | good | 5H | bad | good | good | good | bad |
| Compar. Ex. 2 | 13 | bad | good | good | 4H | good | good | good | good | bad |

EXAMPLE 12

Material for Forming Film-form Protective LaYer:

The same coating solution as prepared in Example 1 for forming a protective layer was coated on a 75 μm-thick polyethylene terephthalate film as a temporary support, and dried to form a 3 μm-thick photosensitive layer for forming a protective layer. The photosensitive layer thus formed was laminated with a 15 μm-thick polypropylene cover sheet to prepare a film-form material for forming a protective layer.

A glass substrate having the same multicolor layer as described in Example 1 was prepared. The cover sheet was first removed from the film-form material obtained above, and then the photosensitive layer of the film-form material was brought into face-to-face contact with the multicolor layer on the glass substrate and made into a laminate using a laminator. Thereafter, the temporary support was peeled away, to thereby dispose the photosensitive layer on the multicolor layer. The thus obtained photosensitive layer was exposed, developed and then heated under the same conditions as in Example 1 to form a protective layer. On the protective layer, ITO electrodes were formed in the same manner as in Example 1. As a result, the ITO electrodes satisfactorily adhered to the protective layer without defects. Thereon, the same oriented film as in Example 1 was formed without swelling the protective layer. The pencil hardness of the protective layer was 5H. Furthermore, the evaluation results of the other criteria are shown in Table 3.

EXAMPLES 13 TO 22, AND COMPARATIVE EXAMPLES 3 AND 4

Film-form materials for forming protective layers were prepared in the same manner as in Example 12, except that Resin Nos. 2 to 13 were used in place of Resin No. 1 respectively. These materials were evaluated by the same methods as adopted in Example 1. The evaluation results are shown in Table 3.

TABLE 3

| Example No. | Polymer No. | Developability | Developer Resistance | Evenness | Hardness | Alkali Resistance | Transmission of Light | Adhesion to Substrate After Development | Adhesion to Substrate After Heating | Capability for Forming Conductive Layer |
| --- | --- | --- | --- | --- | --- | --- | --- | --- | --- | --- |
| 12 | 1 | good | good | good | 5H | good | good | good | good | good |
| 13 | 2 | good | good | good | 5H | good | good | good | good | good |
| 14 | 3 | good | good | good | 5H | good | good | good | good | good |
| 15 | 4 | good | good | good | 5H | good | good | good | good | good |
| 16 | 5 | good | good | good | 5H | good | good | good | good | good |
| 17 | 6 | good | good | good | 5H | good | good | good | good | good |
| 18 | 7 | good | good | good | 5H | good | good | good | good | good |
| 19 | 8 | good | good | good | 5H | good | good | good | good | good |
| 20 | 9 | good | good | good | 5H | good | good | good | good | good |
| 21 | 10 | good | good | good | 5H | good | good | good | good | good |
| 22 | 11 | good | good | good | 5H | good | good | good | good | good |
| Compar. Ex. 3 | 12 | good | good | good | 5H | bad | good | good | bad | bad |
| Compar. Ex. 4 | 13 | bad | good | good | 4H | good | good | good | bad | bad |

As can be seen from Table 2 and Table 3, each of the photosensitive resin compositions of the present invention exhibited excellent properties with respect to all of the evaluation creteria.

The photosensitive resin compositions of the present invention not only have high production suitability but also high solubility in alkaline solutions. Furthermore, photosensitive resin compositions of the present invention can provide images having excellent developer resistance, hardness, alkali resistance, light transmissibility, and good adhesion to a substrate, and can also form a transparent conductive layer. The photosensitive resin compositions of the present invention are particularly useful for forming the protective layer of a color filter, and the protective layer made from a photosensitive resin composition of the present invention has excellent chemical resistance and high surface evenness.

While the invention has been described in detail and with reference to specific examples thereof, it will be apparent to one skilled in the art that various changes and modification can be made therein without departing from the spirit and scope thereof.

What is claimed is:

1. A photosensitive resin composition which comprises (1) a resin, (2) a photopolymerization initiator or a photopolymerization initiating system, and (3) an addition polymerizable monomer having an ethylenically unsaturated double bond, wherein said resin contains at least one repeating unit represented by the following general formulae (I) and (II):

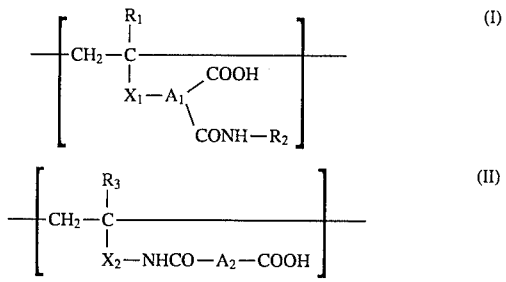

wherein $R_1$ represents a hydrogen atom or a methyl group; $R_2$ represents an alkyl group having 1 to 12 carbon atoms, an aralkyl group having 7 to 16 carbon atoms or an aryl group having 6 to 18 carbon atoms, and each of the alkyl, aralkyl and aryl groups may be branched and may be substituted with an alkyl group having 1 to 4 carbon atoms, an alkoxy group having 1 to 6 carbon atoms, an aryl group having 6 to 10 carbon atoms, an aralkyl group having 7 to 12 carbon atoms, a halogen atom or a combination of two or more thereof; $R_3$ represents a hydrogen atom or a methyl group; $X_1$ represents a single bond, —COO—, —OCO—, —CONR$_5$—, —COO—R$_6$— or —CONR$_7$—R$_8$—; $X_2$ represents a single bond, —COO—, —OCO—, —CONR$_9$—, —COO—R$_{10}$— or —CONR$_{11}$—R$_{12}$—; $A_1$ represents a trivalent organic group which can form an imide ring by a ring closure reaction with COOH and CONH—R$_2$; $A_2$ represents a divalent organic group which can form an imide ring by a ring closure reaction with COOH and NHCO; $R_5$, $R_7$, $R_9$ and $R_{11}$ each represents a hydrogen atom, an alkyl group having 1 to 12 carbon atoms, an aralkyl group having 7 to 16 carbon atoms, or an aryl group having 6 to 18 carbon atoms, and each of the alkyl, aralkyl and aryl groups may be branched and may be substituted with an alkyl group having 1 to 4 carbon atoms, an alkoxy group having 1 to 6 carbon atoms, an aryl group having 6 to 10 carbon atoms, an aralkyl group having 7 to 12 carbon atoms, a hydroxyl group, a halogen atom or a combination of two or more thereof; $R_6$, $R_8$, $R_{10}$ and $R_{12}$ each represents a hydrogen atom, an alkylene group having 1 to 10 carbon atoms, an arylene having 6 to 10 carbon atoms or an aralkylene group having 7 to 20 carbon atoms, and each of the alkylene, arylene and aralkylene groups may be branched, the carbon chain of each group may be interposed by a linkage group selected from the group consisting of —O—, —S—, —OCO—, —COO—, —CONH—, —NHCO—, —SO$_2$—, —SO$_2$NH—, —NHSO$_2$— and combinations of two or more of these linkage groups, and each group may be substituted with an alkyl group having 1 to 4 carbon atoms, an alkoxy group having 1 to 6 carbon atoms, an aryl group having 6 to 10 carbon atoms, an aralkyl group having 7 to 12 carbon atoms, a halogen atom or a combination of two or more thereof.

2. The photosensitive resin composition of claim 1, wherein the content of the resin containing at least one repeating unit represented by formulae (I) and (II) ranges from 20 to 90% by weight based on the solids content of the photosensitive resin composition.

3. The photosensitive resin composition of claim 1, wherein the content of the resin containing at least one repeating unit represented by formulae (I) and (II) ranges from 30 to 70% by weight based on the solids content of the photosensitive resin composition.

* * * * *